(12) United States Patent
Novellini et al.

(10) Patent No.: US 10,291,501 B1
(45) Date of Patent: May 14, 2019

(54) SYSTEMS AND METHODS FOR MEASURING LATENCY OF DATA BUFFERS

(71) Applicant: Xilinx, Inc., San Jose, CA (US)

(72) Inventors: Paolo Novellini, Gorgonzola (IT); Giovanni Guasti, Cornaredo (IT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/886,688

(22) Filed: Feb. 1, 2018

(51) Int. Cl.
*G11C 7/00* (2006.01)
*H04L 12/26* (2006.01)
*G11C 7/10* (2006.01)

(52) U.S. Cl.
CPC .......... *H04L 43/0852* (2013.01); *G11C 7/10* (2013.01); *H04L 43/50* (2013.01); *G11C 2207/2272* (2013.01)

(58) Field of Classification Search
CPC ....... G11C 7/22; G11C 7/1066; G11C 7/1051; G11C 7/1078; G11C 11/4076
USPC ............................................ 365/193, 189.05
See application file for complete search history.

(56) References Cited

U.S. PATENT DOCUMENTS

| 7,594,048 | B1 | 9/2009 | Edwards et al. |
| 8,386,828 | B1 | 2/2013 | Ambatipudi et al. |
| 9,222,976 | B1 * | 12/2015 | Usgaonkar ......... G01R 31/3177 |
| 9,331,724 | B2 | 5/2016 | Novellini et al. |

OTHER PUBLICATIONS

Xilinx, "UltraScale Architecture GTH Transceivers User Guide," UG576 (v1.4), Oct. 21, 2016, pp. 130-145 (27 pages), Xilinx, Inc., San Jose, California, USA.

* cited by examiner

*Primary Examiner* — Son T Dinh
(74) *Attorney, Agent, or Firm* — David O'Brien

(57) ABSTRACT

An integrated circuit (IC) includes a first device and a second device. A latency measurement circuit is configured to determine a first latency of the first device; and determine a second latency of the second device based on the first latency.

20 Claims, 6 Drawing Sheets

US 10,291,501 B1

SYSTEMS AND METHODS FOR MEASURING LATENCY OF DATA BUFFERS

TECHNICAL FIELD

Examples of the present disclosure generally relate to integrated circuits (ICs) and, in particular, to an embodiment related to measuring the latency of data buffers in an IC.

BACKGROUND

Communication systems including high-speed transceivers are used to communicate data between devices. The performance of a communication system may be monitored by measuring the latencies of components of the communication system. In addition, measured latencies may be used to improve the performance of the communication system.

Data buffers (e.g., first in first out (FIFO) data buffers) in the communication system may contribute to the latency of a communication system. In one example, a transmitter used in a serializer-deserializer (SERDES) of the communication system includes a data buffer, and the latency of the data buffer may be affected by the unknown phase relationship between clock signals (e.g., read and write clock signals) and control signals (e.g., a reset signal). For a data buffer with write and read pointers, the latency of the data buffer may be determined from the write and read pointers. However, such a latency may not be determined to a fraction of a cycle (e.g., a unit interval (UI)) of transmit or receive clocks, because the write and read pointers change too quickly.

Accordingly, it would be desirable and useful to provide an improved way of measuring the latency of data buffers in the communication system.

SUMMARY

In some embodiments in accordance with the present disclosure, an integrated circuit (IC) a first device and a second device. A latency measurement circuit is configured to: determine a first latency of the first device; and determine a second latency of the second device based on the first latency.

In some embodiments in accordance with the present disclosure, an integrated circuit (IC) includes a first data buffer, a second data buffer, and a latency measurement circuit. The latency measurement circuit is configured to at a first time, configure the first and second data buffers to each have a first fill level; at a second time after the first time, determine a first latency of the first data buffer; and determine a second latency of the second data buffer at the second time based on the first latency.

In some embodiments, the first device includes a first data buffer. The second device includes a second data buffer. The latency measurement circuit is configured to: at a first time, configure the first and second data buffers to each have a first fill level; at a second time after the first time, determine the first latency; and determine the second latency of the second data buffer at the second time based on the first latency.

In some embodiments, the IC includes a first monitoring circuit configured to generate a first fill level status signal for the first data buffer; and a second monitoring circuit configured to generate a second fill level status signal for the second data buffer. To configure the first and second data buffers to each have the first fill level, the latency measurement circuit is configured to: perform a first adjustment to a first read clock signal for the first data buffer based on the first fill level status signal; and perform a second adjustment to a second read clock signal for the second data buffer based on the second fill level status signal.

In some embodiments, to measure the first latency of the first data buffer, the latency measurement circuit is configured to: at the second time, perform a third adjustment to the first read clock signal for the first data buffer based on the first fill level status signal; and determine the first latency of the first data buffer based on the third adjustment.

In some embodiments, the latency measurement circuit is configured to: at the second time, adjust the first read clock signal for the first data buffer such that the first fill level status signal indicates that the first data buffer is at the first fill level.

In some embodiments, the first monitoring circuit is configured to: obtain a first read address associated with the first read clock signal; obtain a first write address associated with a first write clock signal for the first data buffer; determine a first difference between the first read address and the first write address; and provide the first fill level status signal based on the first difference and the first fill level.

In some embodiments, the first monitoring circuit is configured to: handle a domain crossing based on the first difference with Gray coding.

In some embodiments, the first fill level is selected from a plurality of fill levels comprising an almost empty fill level, an almost full fill level, and a middle point fill level.

In some embodiments, the second data buffer is configured to be used by a first application.

In some embodiments, the first data buffer is configured to receive first input mirror data generated based on first input application data that is provided to an input of the second data buffer.

In some embodiments, the first data buffer is configured to be used by a second application different from the first application, and the second application is less sensitive to jitter injected to a read clock signal for the first data buffer than the first application.

In some embodiments, the second latency has a resolution less than a unit interval of a read clock signal for the second data buffer.

In some embodiments, the second device includes a transmitter.

In some embodiments, a method includes configuring, at a first time, a first data buffer and a second data buffer to each have a first fill level; determining, at a second time after the first time, a first latency of the first data buffer; and determining a second latency of the second data buffer at the second time based on the first latency.

In some embodiments, the method includes: generating a first fill level status signal for the first data buffer; generating a second fill level status signal for the second data buffer; wherein the configuring the first and second data buffers to each have the first fill level includes: performing a first adjustment to a first read clock signal for the first data buffer based on the first fill level status signal; and performing a second adjustment to a second read clock signal for the second data buffer based on the second fill level status signal.

In some embodiments, the measuring the first latency of the first data buffer includes: at the second time, performing a third adjustment to the first read clock signal for the first data buffer based on the first fill level status signal; and determining the first latency of the first data buffer based on the third adjustment.

In some embodiments, the performing the third adjustment to the first read clock signal includes: performing the third adjustment to the first read clock signal such that the first fill level status signal indicates that the first data buffer is at the first fill level.

In some embodiments, the method includes obtaining a first read address associated with the first read clock signal; obtaining a first write address associated with a first write clock signal for the first data buffer; determining a first difference between the first read address and the first write address; and providing the first fill level status signal based on the first difference and the first fill level.

In some embodiments, the method includes handling a domain crossing based on the first difference with Gray coding.

In some embodiments, the method includes receiving, by the first data buffer, first input mirror data generated based on first input application data provided to an input of the second data buffer.

Other aspects and features will be evident from reading the following detailed description and accompanying drawings.

DETAILED DESCRIPTION

Figure 1:
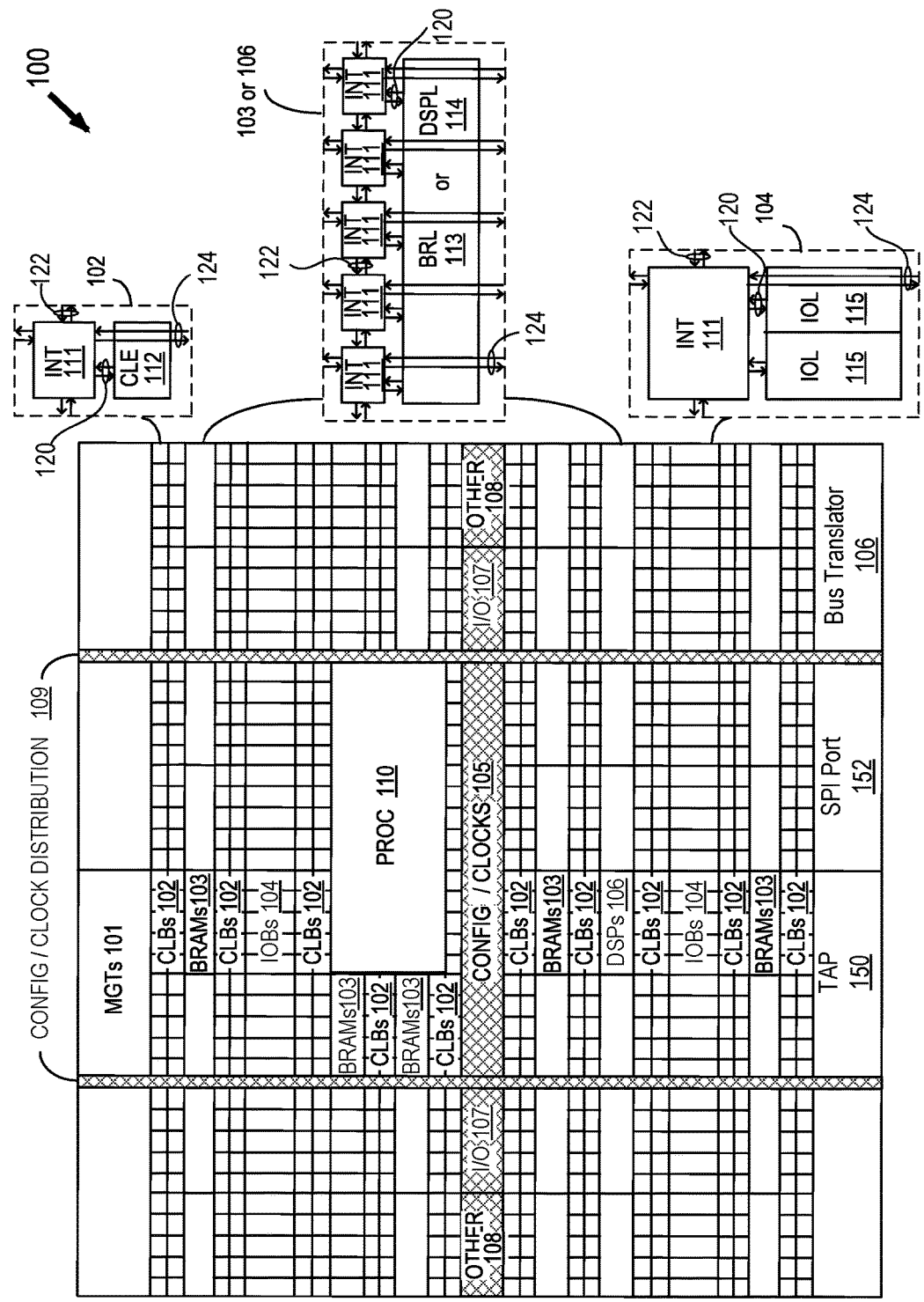
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As discussed above, runtime latency measurement of transmitters in communication systems may help to monitor and improve the performance of various time sensitive applications, including for example, Common Public Radio Interface (CPRI) applications, Open Base Station Architecture Initiative (OBSAI), Precision Time Protocol (PTP) applications defined by IEEE1588, and various wireless applications. However, a latency of a transmitter after the reset may have a limited precision (e.g., not be determined to a fraction of a UI). In an example, a transmitter includes a FIFO data buffer that is N bit wide, where N is an integer. In that example, the transmitter latency may include an unknown latency up to N bits. Such an unknown latency may be caused by an unknown phase relationship between a reset signal and a read clock signal for the FIFO data buffer.

In some embodiments, to achieve better latency measurement, the FIFO data buffer is removed from the data path to setup a complex clocking structure (e.g., using a delay aligner). Such a clocking structure may avoid timing issues when data is moved from a programmable fabric to a SERDES including the transmitter, and the transmitter latency without the FIFO data buffer is known and does not change over time. However, in those embodiments, the phase of the user clocks needs to be controlled by the delay aligner dynamically. This may result in creating multiple clock areas in the programmable fabric to fix the transmitter latency in the SERDES. It may require a control loop which is analog in the SERDES to measure runtime the phase relationship between the clocks reading and writing data in the FIFO data buffer and automatically correct the delay aligner. As such, such a latency measurement system requires special designs in the programmable fabric and the SERDES. In other words, such a latency measurement system may not be implemented in a general purpose SERDES.

In some embodiments, the latency of a transmitter is measured directly by using particular extra hardware (e.g., hardcoded delay aligners, hardcoded phase detectors, etc.) in the SERDES. However, such embodiments may not be implemented in a general purpose SERDES that does not include such particular extra hardware. In those embodiments, the resolution of the latency measurement may be limited by the frequency of a clock added in the SERDES. In some examples, an asynchronous clock may be used to increase the resolution of the measurements beyond the frequency of available clocks in the SERDES. Those examples require accessing real time both the reading and the writing clock signals in the SERDES. However, many SERDES may not support access to the reading clock signal in the SERDES and/or FIFO reading and writing pointers in real time. As such, such a latency measurement system may not be implemented in those SERDES.

For integrated circuit (IC) solutions, it has been discovered that the runtime latency of an operating transmitter including its data buffer may be measured indirectly using another device (also referred to as a mirror device) in the same IC as the transmitter. In various embodiments, by correlating the latencies of the mirror device and the operating transmitter, during normal operation, any latency variation in the operating transmitter may be reflected in the latency variation of the mirror device. As such, the latency of the operating transmitter may be determined based on the latency of the mirror device.

Various advantages may be present in various applications of the present disclosure. No particular advantage is required for all embodiments, and different embodiments may offer different advantages. One of the advantages of some embodiments is that a mirror device may be used to measure directly the latency of the FIFO. Such a mirror device may be any suitable circuit in the IC including the FIFO. Further, such a latency measurement system does not require accessing the FIFO reading and writing pointers real time. As such, no particular extra hardware is needed for latency measurement. Another advantage of some embodiments is that by using phase interpolators to adjust the fill levels of the FIFOs, the resolution of the latency measurement is only limited by the resolution of the PIs. As such, the resolution of the latency measurement better than a unit interval (UI) is achieved. Yet another advantage of some embodiments is that while direct latency measurements may be performed continuously on the mirror device runtime, there is no manipulation of the operating transmitter during normal operation for latency measurement, which improves the performance of the FIFO.

With the above general understanding borne in mind, various embodiments for transmitter latency measurement are generally described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the latency measurement is not limited to the exemplary IC depicted in FIG. 1, and that IC having other configurations, or other types of IC, may also implement the latency measurement.

In various embodiments, a latency of a SERDES transmitter may include a plurality of additive portions, including for example, a digital block latency and a FIFO latency. The digital block latency is usually known and remains the same. The digital block latency may be expressed as a multiple of the UI of the data transmission signal, and is not process, voltage, and temperature (PVT) dependent. The FIFO latency is the latency associated with a FIFO data buffer of the transmitter, is PVT dependent, and usually is a non-integer multiple of the UI. As such, to determine the runtime latency of a transmitter, the latency of the FIFO data buffer of the transmitter needs to be determined.

Figure 2:
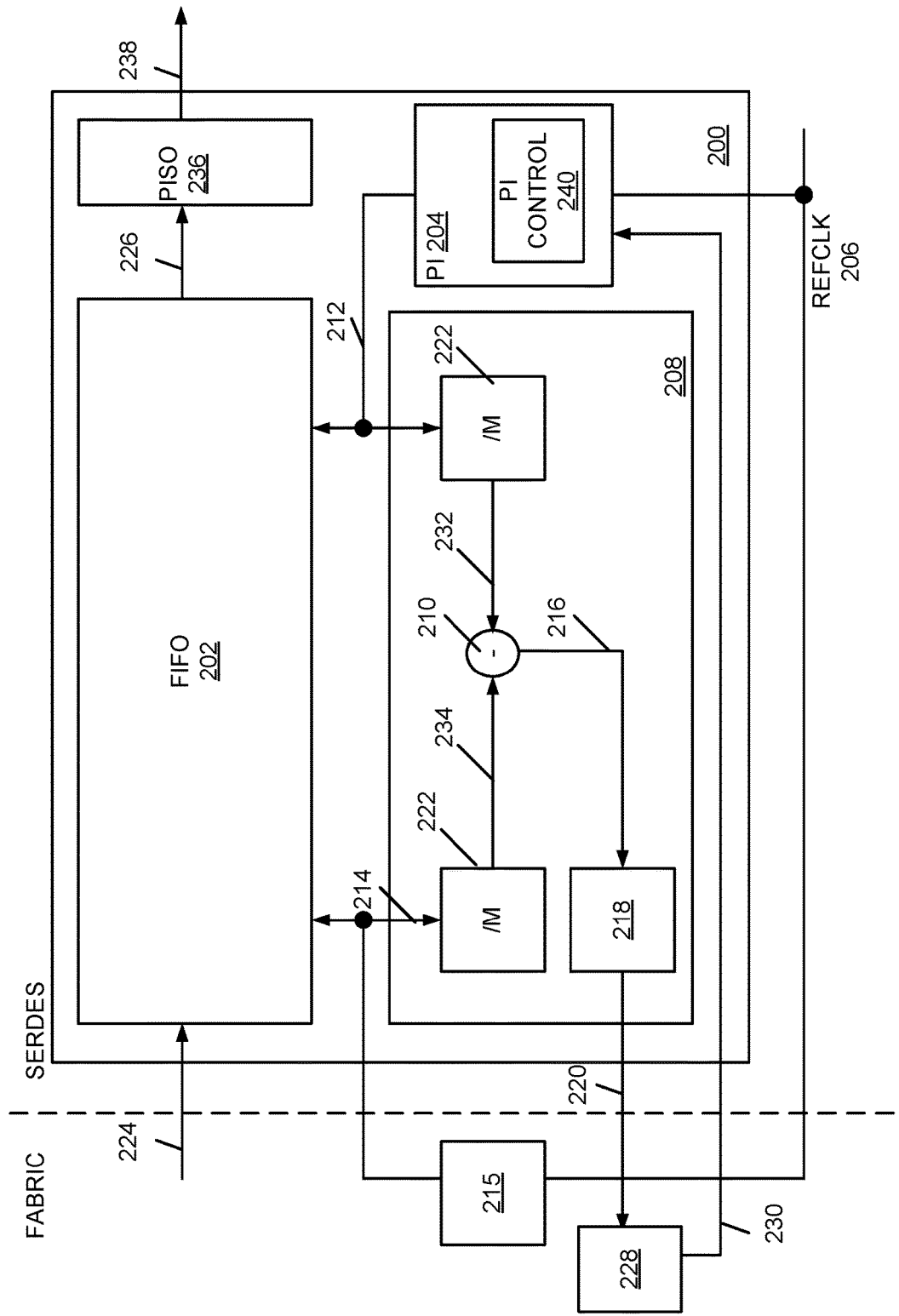
FIG. 2 is a block diagram illustrating a transmitter according to some embodiments of the present disclosure.

Referring to FIG. 2, illustrated therein is a transmitter 200. The transmitter 200 includes a first in first out (FIFO) data buffer 202 (also referred to as a FIFO 202), and a phase interpolator (PI) 204 coupled to the FIFO 202. The FIFO 202 may receive an input signal 224 (e.g., from FPGA fabric or other circuitry). The input data in the input signal 224 may be input or written to the FIFO 202 response to a write clock signal 214. In the example of FIG. 2, the input data may have a width of N, where N is an integer equal to or greater than one. The FIFO 202 may include a memory or a plurality of registers, and may store a plurality of words. In the example of FIG. 2, the FIFO 202 may have a size (depth) of M for storing M words, where each of the M words may be N bit wide. In other words, up to M N-bit wide words that may be stored in the FIFO 202 at one time.

In some embodiments, the FIFO 202 may output an output signal 226. The output signal 226 may be sent to a Parallel-Input-to-Serial-Output data converter ("PISO") 236 to generate serial data output 238. The output data in the output signal 226 may be read responsive to a read clock signal 212.

In some embodiments, the FIFO 202 may be used to buffer data by absorbing skew associated with propagation delays in the write clock signals 214 provided via a clock network 215. A clock network 215 may be used to distribute write clock signals to multiple transmitters, where those write clock signals 214 may have propagations delays sensitive to voltage and/or temperature. On the other hand, the read clock signal 212 may be provided from a PI 204 or another circuit internal to a transmitter, and thus may not have as significant propagation delays due to such proximity. In some embodiments, a depth of a FIFO may be used to accommodate the largest propagation delay. In an example, a FIFO may be sized according to propagation delays of a write clock signal.

In the example of FIG. 2, the FIFO 202 receives the read clock signal 212 from the PI 204. The PI 204 may receive a reference clock 206, and generates the read clock signal 212 based on the reference clock 206. The PI 204 may adjust the phase of the read clock signal 212, which may be used to read data out of the FIFO 202. Such a phase adjustment may be independent for each of a plurality of transmitter of a SERDES, and may have a granularity much smaller than the UI. In some embodiments, modulating the PI to adjust the phase of the read clock signal 212 is equivalent to modulating a fill level of the FIFO 202.

As shown in the example of FIG. 2, the transmitter 200 includes a monitoring circuit 208 for monitoring the fill level of the FIFO 202. The monitoring circuit 208 receives a read clock signal 212 for the FIFO 202 from the PI 204, and a write clock signal 214 for the FIFO 202 from the clock network 215. The read clock signal 212 may be sent to a counter and divider 222 with a divisor (e.g., M) that is equal to the depth of the FIFO 202, which may generate a read address 232. At the same time, the write clock signal 212 may be sent to a counter and divider with a divisor (e.g., M), which may generate a write address 234. A subtractor 210 generates a difference 216 between the read address 232 and the write address 234.

In some embodiments, the difference 216 may indicate a difference in phase between a read clock signal 212 and a corresponding write clock signal 214. Difference 216 may be used to determine a domain crossing. Such a domain crossing may be identified using Gray coding. In those embodiments, the subtractor 210 may be more complex than just determining a difference between two addresses, because the write address 234 and read address 232 are generated from two separate clock signals which may be out of phase with respect to one another. Because read and write addresses may evolve on clocks with an unknown relative phase relationship, difference 216 may be obtained by moving both read and write addresses with reference to a common clock, using Gray coding for address values. Thus, a difference may be associated with crossing a domain in a particular direction, and so Gray coding is one example of generation of such a difference by having counters (e.g., a read address counter and a write address counter) in subtractor 210 coupled to use Gray coding. However, other types of coding may be used.

In some embodiments, a comparator 218 compares the difference 216 with a predetermined FIFO fill level, and determines whether the difference 216 is less than or equal to that predetermined FIFO fill level. The comparator 218 generates a fill level status signal 220. In an example, the comparator 218 determines that the difference 216 is less than the predetermined FIFO fill level, and provide the fill level status signal 220 having a value of 0. In another example, the comparator 218 determines that the difference 216 is greater than the predetermined FIFO fill level, and provide the fill level status signal 220 with a value of 1. In yet another example where the difference 216 is equal to the predetermined FIFO fill level, the fill level status signal 220 may toggle between 0 and 1. The predetermined FIFO fill level may be an almost full fill level (e.g., over 90% of the depth of the FIFO 202), an almost empty fill level (e.g., under 10% of the depth of the FIFO 202), a half-full fill level (e.g., at about 50% of the depth of the FIFO 202 or M/2), or any other fill level of the FIFO 202. The predetermined fill level may be tailored to a particular application and/or an integrated circuit device, and may be set to different values for different applications and/or devices.

A control circuit 228 may be used to set the FIFO 202 to the predetermined fill level after a startup or reset sequence based on the fill level status signal 220. The control circuit 228 (e.g., located in the programmable fabric) may receive the fill level status signal 220, generate a PI control signal 230 based on the fill level status signal 220, and send the PI control signal 230 to a PI control block 240 of the PI 204. The PI control block 240 may adjust (e.g., increase, decrease) the phase of the read clock signal 212 based on the PI control signal 230. In an example, the control circuit 228 determines that the fill level status signal 220 has a value (e.g., toggling between "0" and "1") indicating that the FIFO 202 has the predetermined fill level, and stops the adjustment to the read clock signal 212 using the PI 204. In another example, the control circuit 228 determines that the fill level status signal 220 has a value (e.g., "0" or "1") indicating that the FIFO 202 has a fill level that is not equal to the predetermined fill level, and continues to adjust the read clock signal 212 using the PI 204. In some embodiments, PI 204 may stop adjusting the read clock signal 212 when the fill level status signal 220 switches from a logic 1 to a logic 0, or from a logic 0 to logic 1. Such a transition in logic state of the fill level status signal 220 may mark the end of an adjustment phase, which may be used for set the fill level of the FIFO 202 with a high resolution (e.g., less than a UI), which may be limited only by the resolution of the PI 204.

In various embodiments, PI 204 may be used to shift the phase of data to be transmitted, independently on each transmitter of an IC. In some embodiments, instead of using PIs, a bit slip circuit in the transmitter may be used to shift the phase of data to be transmitted based on the bit loss/gain caused by clock drift. While the bit slip circuit may provide a lower precision of the latency measurement than the PI 204, it provides more flexibility in implementing the latency measurement system.

Figure 3:
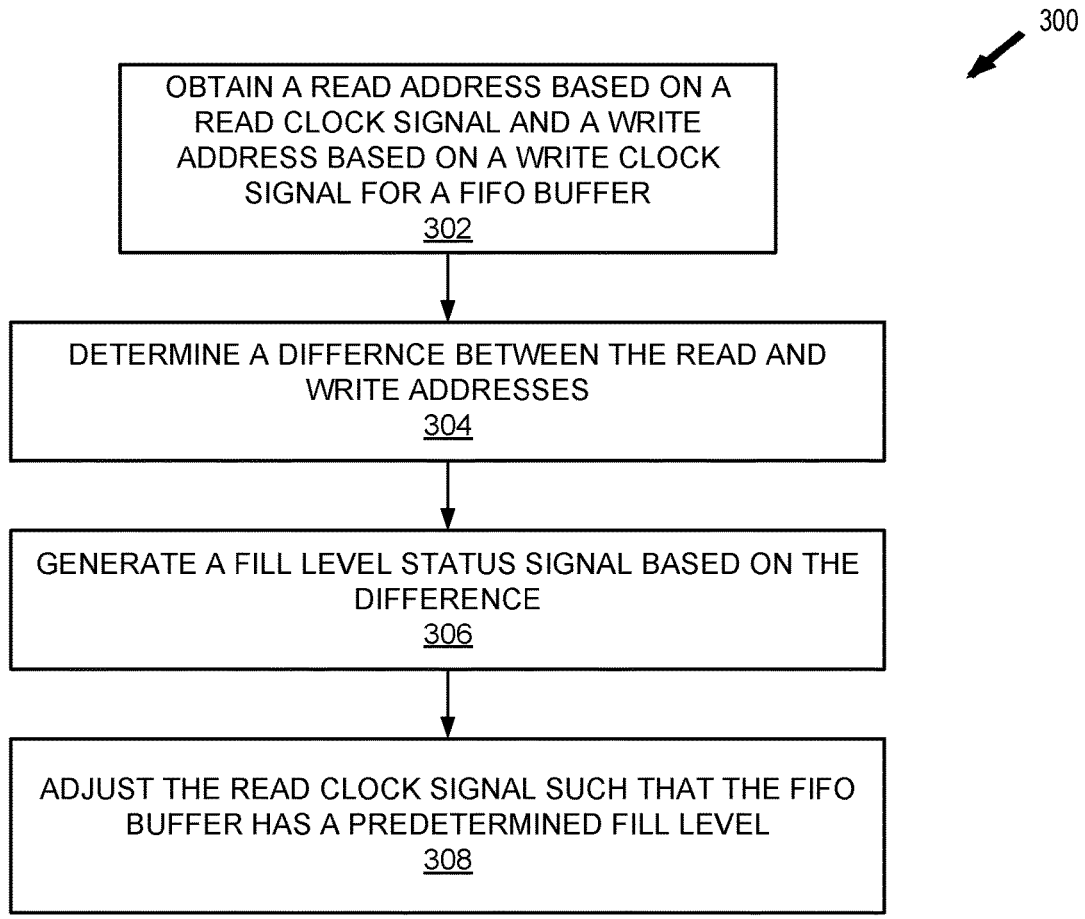
FIG. 3 is a flow diagram illustrating a method for adjusting and monitoring a fill level of a data buffer according to some embodiments of the present disclosure.

Referring to FIG. 3, illustrated is a method 300 for adjusting and monitoring a fill level of a FIFO (e.g., a FIFO 202 of FIG. 2). The method 300 begins at block 302, where a monitoring circuit 208 obtains a read address 232 for the FIFO 202 using a counter and divider 222 based on a read clock signal 212. At block 302, the monitoring circuit 208 also obtains a write address 234 for the FIFO 202 using a counter and divider 222 based on a write clock signal 214 at the same time.

The method 300 may then proceed to block 304, where the monitoring circuit 208 determines a difference 216 between the read address 232 and write address 304 by using a subtractor 210. In some embodiments, the monitoring circuit 208 including the subtractor 210 implements Gray coding to handle domain crossing such that it operates correctly between two asynchronous clock domains of the read clock signal 212 and write clock signal 214 respectively.

The method 300 may then proceed to block 306, where the monitoring circuit 208 uses a comparator 218 to compare the difference 216 with a predetermined fill level, and generates a fill level status signal 220 based on the comparison result.

The method 300 may then proceed to block 308, where a control circuit 228 controls the PI 204 to adjust the phase of the read clock signal 212, such that the FIFO 202 has the predetermined fill level. The control circuit 228 may stop the adjustment to the read clock signal 212 by the PI 204 after it determines that the FIFO 202 has the predetermined fill level (e.g., where the fill level status signal 220 toggles between 0 and 1).

Figure 4:
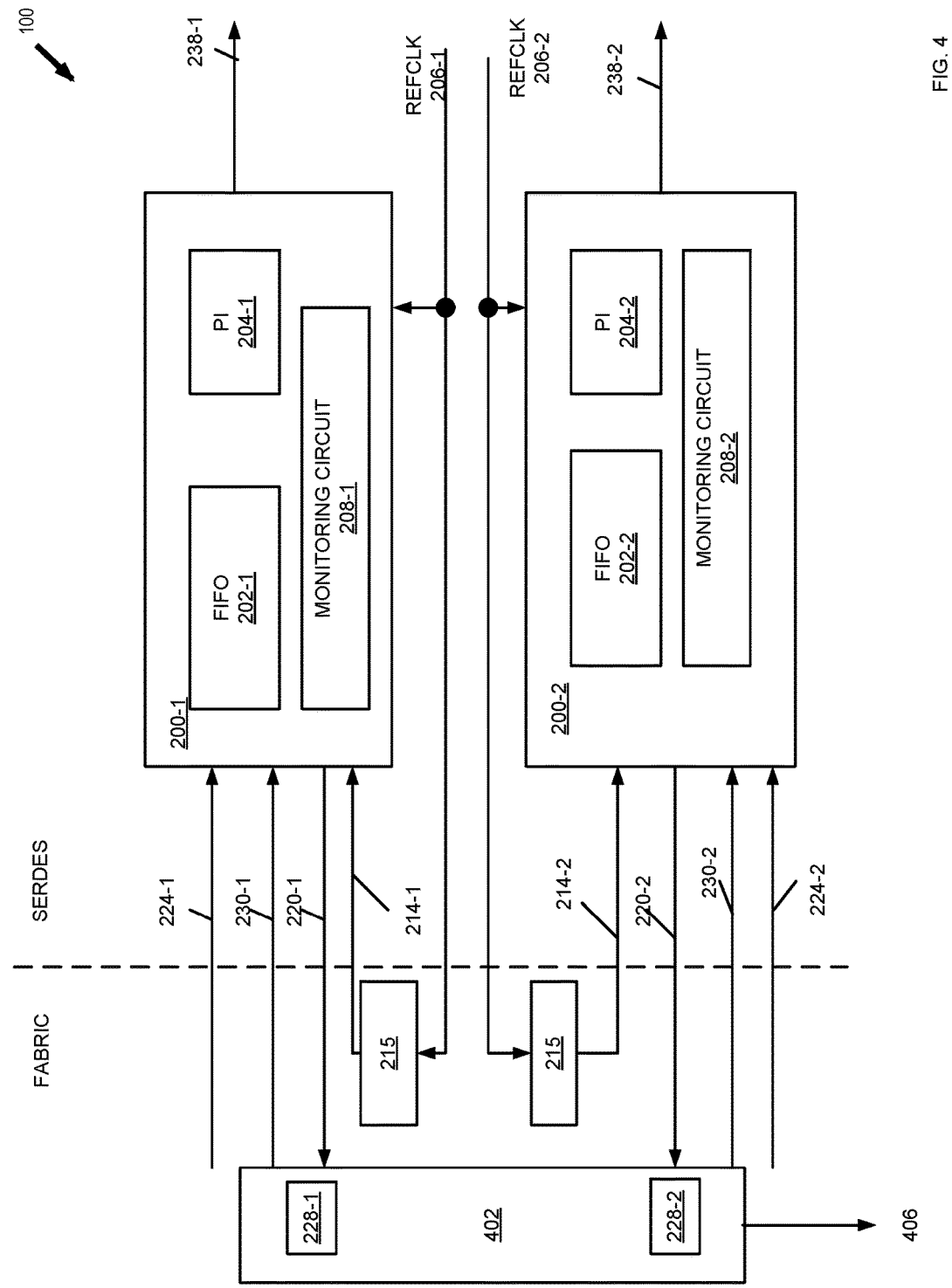
FIG. 4 is a block diagram illustrating a latency measurement system for a transmitter according to some embodiments of the present disclosure.
Figure 5:
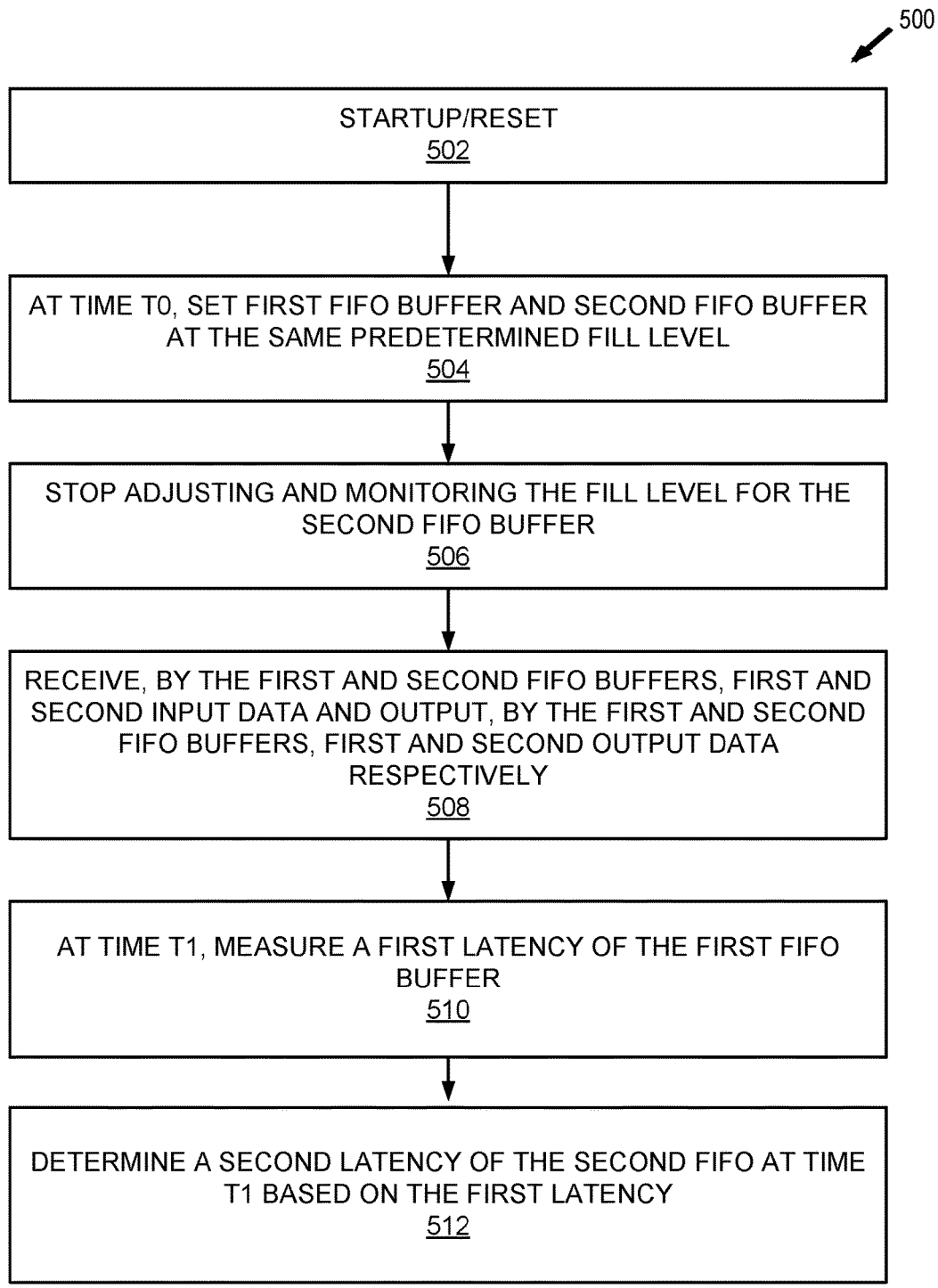
FIG. 5 is a flow diagram illustrating a method for measuring latency for a transmitter according to some embodiments of the present disclosure.

Referring to FIGS. 4 and 5, in some embodiments, a latency of a particular data buffer may be measured using a mirror device on the same IC, where the latency variation of the mirror device (e.g., caused by PVT) is the same as the latency variation of that particular data buffer. While in the example below the mirror device includes a data buffer, in other examples, any suitable circuit (e.g., a phase detector comparing the clock phase at the input and the output of a clock network in the IC) in the same IC may be used as the mirror device to measure the latency variation. In those examples, there is no need to use a transmitter to setup the mirror device.

Referring to the example of FIG. 4, a latency measurement system using a mirror device for measuring the data buffer is described. The IC 100 includes a plurality of transmitters 200 (e.g., transmitter 200 of FIG. 2) including transmitters 200-1 and 200-2. The transmitter 200-1 may receive input data 224-1 in parallel, and outputs output data 238-1 in serial. The transmitter 200-2 receives input data 224-2 in parallel, and outputs output data 238-2 in serial. The IC 100 further includes a latency measurement circuit 402 including a control circuit 228-1 for the transmitter 200-1 and a control circuit 228-2 for the transmitter 200-2. The latency measurement circuit 402 receives a fill level status signal 220-1 associated with a fill level of the FIFO 202-1 from the monitoring circuit 208-1 of the transmitter 200-1. The latency measurement circuit 402 further receives a fill level status signal 220-2 associated with a fill level of the FIFO 202-2 from the monitoring circuit 208-2 of the transmitter 200-2. The latency measurement circuit 402 may send a PI control signal 230-1 to the transmitter 200-1 for controlling the PI 204-1, and send a PI control signal 230-2 to the transmitter 200-2 for controlling the PI 204-2. The latency measurement circuit 402 may generate a latency measurement for the transmitter 200-2 including its FIFO 202-2 by measuring the latency of the transmitter 200-1 (also referred to as a mirror device) including its FIFO 202-1, and output the latency measurement for the transmitter 200-2 in the signal 406.

Referring to FIG. 5, illustrated therein is a method 500 for latency measurement of a transmitter (e.g., transmitter 200-2) including its FIFO (e.g., FIFO 202-2) using a mirror device (e.g., transmitter 200-1 including its FIFO 202-1). The method 500 begins at block 502, where transmitters 200 of the IC 100, including transmitters 200-1 and 200-2, are started as part of a startup or reset procedure. At block 502, a transmitter FIFO reset may be a last operation in a reset procedure for a SERDES. After the reset of FIFOs 202-1 and 202-2, each of those FIFOs 202-1 and 202-2 may have fill levels that are "roughly" the same (e.g., at about a half-full fill level). However, the fill levels of the FIFOs 202-1 and 202-2 after reset may have a limited resolution, which affects the resolution of the latency. In an example where the FIFOs 202-1 and 202-2 are N bit wide, the latency of each of the FIFOs 202-1 and 202-2 after reset may include an unknown latency up to N bits. Such an unknown latency may be caused by an unknown phase relationship between a reset signal and a read clock signal for each of the FIFOs 202-1 and 202-2. As such, in some embodiments, two or more identical transmitters (e.g., transmitters 200-1 and 200-2) may come out of reset with different latencies, as their FIFOs (e.g., FIFOs 202-1 and 202-2) may be at different fill levels.

In some embodiments, after a startup or reset procedure, fill levels of the FIFOs 202-1 and 202-2 are "roughly" the same (e.g., at a predetermined fill level for generating the fill level status signals 220-1 and 220-2). However, because of the limited resolution of the fill levels and latency set by the startup or reset procedures, each of the FIFOs 202-1 and 202-2 may be at the predetermined fill level, slightly over the predetermined fill level, or slightly below the predetermined fill level. As such, each of the fill level status signals 220-1 and 220-2 may have a value of 0, 1 or that toggles between 0 and 1.

The method 500 may then proceed to block 504, where at time T0, each of the FIFOs 202-1 and 202-2 is set to the same predetermined fill level (e.g., subject to the resolutions of the PIs 204-1 and 204-2 respectively). For example, at block 504, a control circuit 228-1 of the latency measurement circuit 402 may control the PI 204-1 of the transmitter 200-1 to set the FIFO 202-1 at a predetermined fill level (e.g., according to the method 300 of FIG. 3). For further example, at block 504, a control circuit 228-2 of the latency measurement circuit 402 may control the PI 204-2 of the transmitter 200-2 to set the FIFO 202-2 at that predetermined fill level (e.g., according to the method 300 of FIG. 3).

At the moment that block 504 is completed, the FIFOs 202-1 and 202-2 have fill levels that are exactly at the predetermined fill level, subject to a resolution of the PIs 204-1 and 204-2. In other words, after reset, the latencies of the FIFOs 202-1 202-2 are correlated. After block 504 is completed, the fill levels the FIFOs 202-1 and 202-2 may change over time (e.g., due to PVT). However, FIFOs 202-1 and 202-2 have the same latency change, because the latency change depends only on the clock network latency variation due to PVT. As such, as described in detail below, a latency of the FIFO 202-2 may be determined (measured indirectly) by a latency measured on the mirror device, the FIFO 202-1. In other words, after block 504 is completed, the application transmitter 200-2 including its FIFO 202-2 does not need to be manipulated any more for latency measurement.

The method 500 may then proceed to block 506, where the latency measurement circuit 402 stops adjusting and monitoring the fill level monitoring for the FIFO 202-2. In some embodiments, after block 504, the latency measurement circuit 402 does not need to control the PI 204-2 for adjusting the fill level of the FIFO 202-2 for measuring the latency of the FIFO 202-2. As such, in those embodiments, the latency measurement circuit 402 may stop the fill level monitoring for the FIFO 202-2 (e.g., by stopping the PI 204-2 from adjusting the read clock signal for the FIFO 202-2). In those embodiments, the fill level status signal 220-2 stops updating its value based on the fill level of the FIFO 202-2. As such, the output quality of the FIFO 202-2 is improved by avoiding jitter introduced by a continuously running PI 204-2 that adjusts the read clock signal.

On the other hand, at block 506, the latency measurement circuit 402 may not stop adjusting and monitoring the fill level of the FIFO 202-1. Such a continuously running PI 204-1 and a valid fill level status signal 220-1 enable the latency measurement circuit 402 to measure the latency of the FIFO 202-1 at runtime continuously.

The method 500 may then proceed to block 508, where each of the FIFOs 202-1 and 202-2 receives input data and outputs output data. At block 506, FIFO 202-1 receives input data 224-1 and outputs output data for generating the output data 238-1. At the same time, FIFO 202-2 receives input data 224-2.

In some embodiments, the transmitter 200-1 is used just as a mirror device for latency measurement of an application transmitter 200-2. In some embodiments, a mirror FIFO (e.g., FIFO 202-1) of a mirror transmitter (e.g., the transmitter 200-1) may serve as a mirror device for several FIFOs of application transmitters. In an example, the transmitters including the mirror transmitter and the application transmitters have the same line rate. In another example, those transmitters have line rates different from each other.

In some embodiments, the mirror transmitter 200-1 is not used as an operating transmitter for any application, and the input data 224-1 may be generated by mirroring the input data 224-2.

In some embodiments, the mirror transmitter 200-1 is also an application transmitter, and transmitters 200-1 and 200-2 are associated with the same application. In an example, transmitters 200-1 and 200-2 correspond to two lanes of a SERDES. In that example, parallel data is provided as input data 224-1 and 224-2 to the FIFOs 202-1 and 202-2 respectively and provides output data from FIFOs 202-1 and 202-2 for subsequent serialization (e.g., by a PISO) to generate serialized data.

In some embodiments, the mirror transmitter 200-1 is also an application transmitter, and transmitters 200-1 and 200-2 are associated with different applications. For example, a first application served by the mirror transmitter 200-1 is less sensitive to jitter caused by phase adjustments of the read clock signal caused by the PI 204-1 than a second application served by the transmitter 200-2. In that example, the first application may be an application implementing Peripheral Component Interconnect (Pcie) Express or Serial AT Attachment (SATA). The second application may be an application implementing Synchronous optical networking (SONET)/synchronous digital hierarchy (SDH), CPRI, or IEEE1588.

The method 500 may then proceed to block 510, where a first latency of the FIFO 202-1 is measured at time T1 after time T0. Such a first latency may include a latency change of the FIFO 202-1 at time T1 since time T0. Such a latency change may correspond to a difference between the fill level of FIFO 202-1 at time T1 and the predetermined fill level of FIFO 202-1 set at time T0. In some embodiments, at time T1, the control circuit 228-1 of the latency measurement circuit 402 controls the PI 204-1 of the transmitter 200-1 to set the FIFO 202-1 back to the predetermined fill level (e.g., according to the method 300 of FIG. 3). For example, the PI 204-1 may make a phase adjustment to the read clock signal for the FIFO 202-1, such that the fill level status signal 220-1 indicates that the FIFO 202-1 is at the predetermined fill level. As such, the latency change may be determined based on that phase adjustment to the read clock signal.

The method 500 may then proceed to block 512, where a second latency of the FIFO 202-2 at time T1 is determined based on the first latency of the FIFO 202-1. In some embodiments, the latency change of the FIFO 202-2 between times T1 and T0 is the same as the latency change of the FIFO 202-1 between times T1 and T0. As such, the second latency of the FIFO 202-2 at time T1 is the same as the first latency of the FIFO 202-1 at time T1 that is measured at block 510.

Figure 6:
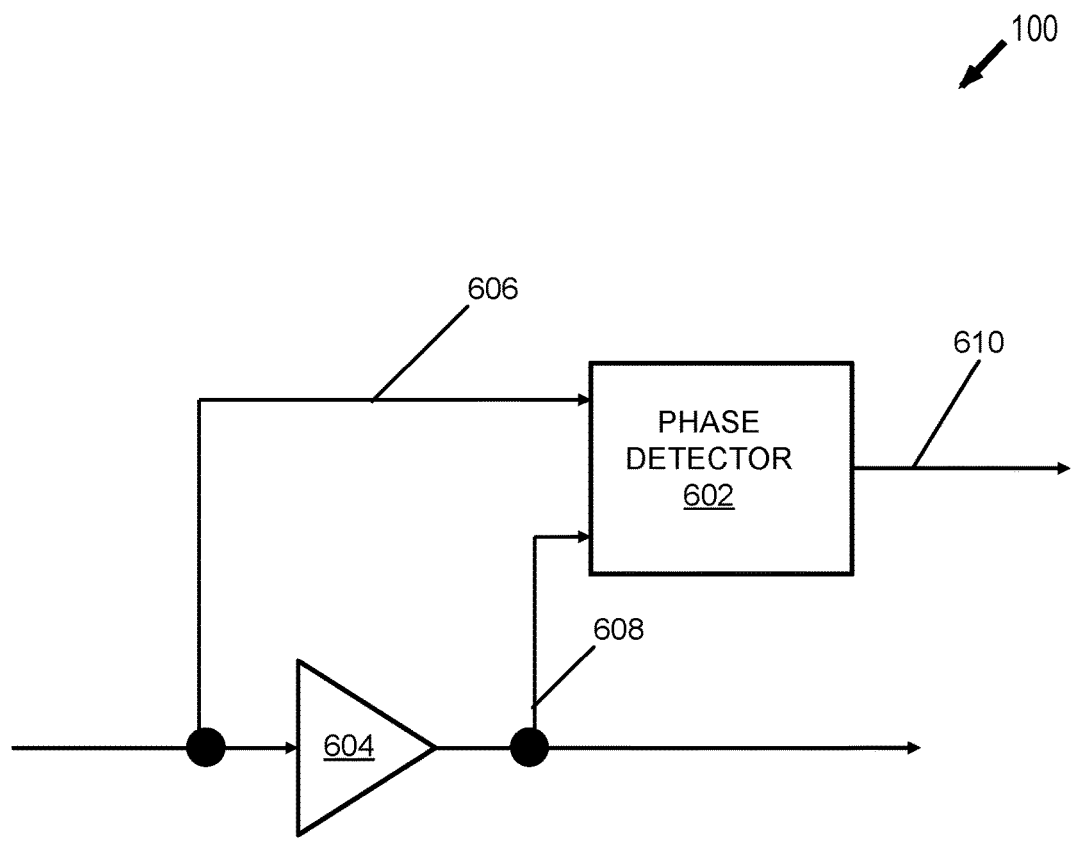
FIG. 6 is a block diagram illustrating a phase detector for measuring latency according to some embodiments of the present disclosure.

Referring to FIG. 6, in some examples, a phase detector in the same IC as a target operating device (e.g., an operating transmitter) may compare the clock phase at the input and the output of a clock network in the IC, and may be used in place of the mirror device for measuring the latency variation. In those examples, there is no need to use a transmitter to setup the mirror device. In the example of FIG. 6, the IC 100 includes a phase detector 602 and a clock network 604. The phase detector 602 receives an input 606 and an output 608 of the clock network 604, performs a comparison between the input 606 and output 608, and generates a latency variation measurement 610. A latency of the target operating device may be determined based on the latency variation measurement 610.

It is noted that various configurations illustrated in FIGS. 1-6 are exemplary only and not intended to be limiting beyond what is specifically recited in the claims that follow. It will be understood by those skilled in that art in possession of this disclosure that other configurations may be used. For example, instead of using PIs, a bit slip circuit in the transmitter may be used to shift the phase of data to be transmitted based on the bit loss/gain caused by clock drift.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An integrated circuit (IC), comprising:
a first device including a first data buffer;
a second device;
a latency measurement circuit configured to:
    at a first time, configure the first data buffer to have a first fill level;
    at a second time after the first time, determine a first latency of the first device; and
    determine a second latency of the second device at the second time based on the first latency.

2. The IC of claim 1,
wherein the second device includes a second data buffer, and
wherein the latency measurement circuit is configured to:
    at the first time, configure the second data buffer to have the first fill level.

3. The IC of claim 2, further comprising:
a first monitoring circuit configured to generate a first fill level status signal for the first data buffer; and
a second monitoring circuit configured to generate a second fill level status signal for the second data buffer;
wherein to configure the first and second data buffers to each have the first fill level, the latency measurement circuit is configured to:
    perform a first adjustment to a first read clock signal for the first data buffer based on the first fill level status signal; and
    perform a second adjustment to a second read clock signal for the second data buffer based on the second fill level status signal.

4. The IC of claim 3, wherein to measure the first latency of the first data buffer, the latency measurement circuit is configured to:
- at the second time, perform a third adjustment to the first read clock signal for the first data buffer based on the first fill level status signal; and
- determine the first latency of the first data buffer based on the third adjustment.

5. The IC of claim 4, wherein the latency measurement circuit is configured to:
- at the second time, adjust the first read clock signal for the first data buffer such that the first fill level status signal indicates that the first data buffer is at the first fill level.

6. The IC of claim 3, wherein the first monitoring circuit is configured to:
- obtain a first read address associated with the first read clock signal;
- obtain a first write address associated with a first write clock signal for the first data buffer;
- determine a first difference between the first read address and the first write address; and
- provide the first fill level status signal based on the first difference and the first fill level.

7. The IC of claim 6, wherein the first monitoring circuit is configured to:
- handle a domain crossing based on the first difference with Gray coding.

8. The IC of claim 2, wherein the first fill level is selected from a plurality of fill levels comprising an almost empty fill level, an almost full fill level, and a middle point fill level.

9. The IC of claim 2, wherein the second data buffer is configured to be used by a first application.

10. The IC of claim 9, wherein the first data buffer is configured to:
- receive first input mirror data generated based on first input application data that is provided to an input of the second data buffer.

11. The IC of claim 9, wherein the first data buffer is configured to be used by a second application different from the first application, and
- wherein the second application is less sensitive to jitter injected to a read clock signal for the first data buffer than the first application.

12. The IC of claim 2, wherein the second latency has a resolution less than a unit interval of a read clock signal for the second data buffer.

13. The IC of claim 2, wherein the second device includes a transmitter.

14. A method, comprising:
- configuring, at a first time, a first data buffer and a second data buffer to each have a first fill level;
- determining, at a second time after the first time, a first latency of the first data buffer; and
- determining a second latency of the second data buffer at the second time based on the first latency.

15. The method of claim 14, further comprising:
- generating a first fill level status signal for the first data buffer; and
- generating a second fill level status signal for the second data buffer;
- wherein the configuring the first and second data buffers to each have the first fill level includes:
  - performing a first adjustment to a first read clock signal for the first data buffer based on the first fill level status signal; and
  - performing a second adjustment to a second read clock signal for the second data buffer based on the second fill level status signal.

16. The method of claim 15, wherein the measuring the first latency of the first data buffer includes:
- at the second time, performing a third adjustment to the first read clock signal for the first data buffer based on the first fill level status signal; and
- determining the first latency of the first data buffer based on the third adjustment.

17. The method of claim 16, wherein the performing the third adjustment to the first read clock signal includes:
- performing the third adjustment to the first read clock signal such that the first fill level status signal indicates that the first data buffer is at the first fill level.

18. The method of claim 15, further comprising:
- obtaining a first read address associated with the first read clock signal;
- obtaining a first write address associated with a first write clock signal for the first data buffer;
- determining a first difference between the first read address and the first write address; and
- providing the first fill level status signal based on the first difference and the first fill level.

19. The method of claim 18, further comprising:
- handling a domain crossing based on the first difference with Gray coding.

20. The method of claim 14, wherein the first fill level is selected from a plurality of fill levels comprising an almost empty fill level, an almost full fill level, and a middle point fill level.

* * * * *